US012614695B2

(12) United States Patent
Eder-Kapl et al.

(10) Patent No.: US 12,614,695 B2
(45) Date of Patent: Apr. 28, 2026

(54) MULTI-BEAM PATTERN DEFINITION DEVICE

(71) Applicant: IMS Nanofabrication GmbH, Brunn am Gebirge (AT)

(72) Inventors: Stefan Eder-Kapl, Vienna (AT); Elmar Platzgummer, Vienna (AT); Christoph Spengler, Vienna (AT); Matthias Liertzer, Hinterbrühl (AT)

(73) Assignee: IMS Nanofabrication GmbH, Brunn am Gebirge (AT)

( * ) Notice: Subject to any disclaimer, the term of this patent is extended or adjusted under 35 U.S.C. 154(b) by 241 days.

(21) Appl. No.: 18/311,826

(22) Filed: May 3, 2023

(65) Prior Publication Data

US 2023/0360880 A1     Nov. 9, 2023

(30) Foreign Application Priority Data

May 4, 2022     (EP) ..................................... 22171589

(51) Int. Cl.
H01J 37/317     (2006.01)
H01J 37/04     (2006.01)
H01J 37/147     (2006.01)

(52) U.S. Cl.
CPC ........ H01J 37/3177 (2013.01); H01J 37/045 (2013.01); H01J 37/1472 (2013.01);
(Continued)

(58) Field of Classification Search
CPC .. H01J 37/3177; H01J 37/045; H01J 37/1472; H01J 2237/1501;
(Continued)

(56) References Cited

U.S. PATENT DOCUMENTS

| 2,369,796 | A | 2/1945 | Ramberg |
| 2,714,678 | A | 8/1955 | Otto |

(Continued)

FOREIGN PATENT DOCUMENTS

| DE | 869995 | C | 3/1953 |
| DE | 892036 | C | 10/1953 |

(Continued)

OTHER PUBLICATIONS

Extended European Search Report for European Application No. 22172309.1, Search completed Dec. 19, 2022, Mailed Jan. 18, 2023, 22 pgs.

(Continued)

*Primary Examiner* — David E Smith
(74) *Attorney, Agent, or Firm* — KPPB LLP

(57)     ABSTRACT

The invention relates to a multi-beam pattern definition device for use in a particle-beam processing or inspection apparatus, said device being adapted to be irradiated with a beam of electrically charged particles and allow passage of the beam through a plurality of apertures thus forming a corresponding number of beamlets, said device comprising an aperture array device in which at least two sets of apertures are realized, an opening array device located downstream of the aperture array device having a plurality of openings configured for the passage of beamlets, said opening array device comprises impact regions, wherein charged impinge upon said impact regions.

12 Claims, 7 Drawing Sheets

(52) U.S. Cl.
CPC .................. *H01J 2237/0437* (2013.01); *H01J 2237/1501* (2013.01); *H01J 2237/151* (2013.01); *H01J 2237/31754* (2013.01); *H01J 2237/31755* (2013.01); *H01J 2237/31774* (2013.01)

(58) Field of Classification Search
CPC ....... H01J 2237/151; H01J 2237/31754; H01J 2237/31755; H01J 2237/31756
See application file for complete search history.

(56) References Cited

U.S. PATENT DOCUMENTS

| | | | |
|---|---|---|---|
| 3,100,260 | A | 8/1963 | Wilska |
| 6,768,125 | B2 | 7/2004 | Platzgummer et al. |
| 6,858,118 | B2 | 2/2005 | Platzgummer et al. |
| 7,772,574 | B2 | 8/2010 | Stengl et al. |
| 7,777,201 | B2* | 8/2010 | Fragner ................. B82Y 10/00 |
| | | | 250/397 |
| 7,781,748 | B2 | 8/2010 | Platzgummer |
| 8,198,601 | B2 | 6/2012 | Platzgummer et al. |
| 8,222,621 | B2 | 7/2012 | Fragner et al. |
| 8,378,320 | B2 | 2/2013 | Platzgummer |
| 8,546,767 | B2* | 10/2013 | Platzgummer ........ H01J 37/045 |
| | | | 250/492.2 |
| 9,053,906 | B2 | 6/2015 | Platzgummer |
| 9,165,745 | B2 | 10/2015 | Luo |
| 9,269,543 | B2 | 2/2016 | Reiter et al. |
| 9,443,699 | B2 | 9/2016 | Platzgummer et al. |
| 9,495,499 | B2 | 11/2016 | Platzgummer et al. |
| 9,520,268 | B2 | 12/2016 | Platzgummer |
| 9,922,796 | B1 | 3/2018 | Frosien et al. |
| 10,483,080 | B1 | 11/2019 | Cook et al. |
| 2002/0096644 | A1 | 7/2002 | Simizu |
| 2004/0135102 | A1 | 7/2004 | Muraki et al. |
| 2007/0057204 | A1 | 3/2007 | Kruit et al. |
| 2009/0114818 | A1 | 5/2009 | Casares et al. |
| 2009/0159810 | A1 | 6/2009 | Knippelmeyer et al. |
| 2009/0173887 | A1 | 7/2009 | Ito et al. |
| 2009/0212229 | A1 | 8/2009 | Wieland et al. |
| 2015/0021476 | A1 | 1/2015 | Shanel |
| 2015/0357157 | A1* | 12/2015 | Mueller ................. H01J 37/10 |
| | | | 250/396 R |
| 2017/0294287 | A1 | 10/2017 | Knippelmeyer et al. |
| 2020/0312619 | A1 | 10/2020 | Mangnus et al. |
| 2022/0246388 | A1 | 8/2022 | Rauwolf et al. |
| 2022/0277921 | A1 | 9/2022 | Cook et al. |
| 2023/0360878 | A1 | 11/2023 | Puchberger et al. |
| 2024/0304415 | A1 | 9/2024 | Spengler et al. |

FOREIGN PATENT DOCUMENTS

| | | |
|---|---|---|
| DE | 893107 C | 10/1953 |
| DE | 1035813 B | 8/1958 |
| EP | 2187427 A2 | 5/2010 |
| EP | 2363875 A1 | 9/2011 |
| GB | 689527 A | 4/1953 |
| WO | 2006053358 A1 | 5/2006 |
| WO | 2012041464 A1 | 4/2012 |
| WO | 2022248196 A1 | 12/2022 |

OTHER PUBLICATIONS

Extended European Search Report for European Application No. 22189892.7, Search completed Feb. 20, 2023, Mailed Mar. 21, 2023, 10 Pgs.
Mueller, "Regelbare magnetostatische Linsensysteme fur Elektronenmikroskope—[Variable magnetostatic lens systems for electron microscopes]", Zeitschrift fur Wissenschaftliche Mikroskopie und Furmikroskopische Technik, Hirzel Verlag, Stuttgart, De, May 31, 1957, vol. 63, No. 5, pp. 303-328, XP009521932.
Extended European Search Report for European Application No. 22171589.9, Search completed Oct. 24, 2022, Mailed Nov. 11, 2022, 5 Pgs.
Extended European Search Report for European Application No. 23160723.5, Search completed Aug. 21, 2023, Mailed Aug. 31, 2023, 11 Pgs.

* cited by examiner

102

241     236

23

22    26

26 pf 24      242      24

243

25 pf     22

201

202

203

24      242      24

25

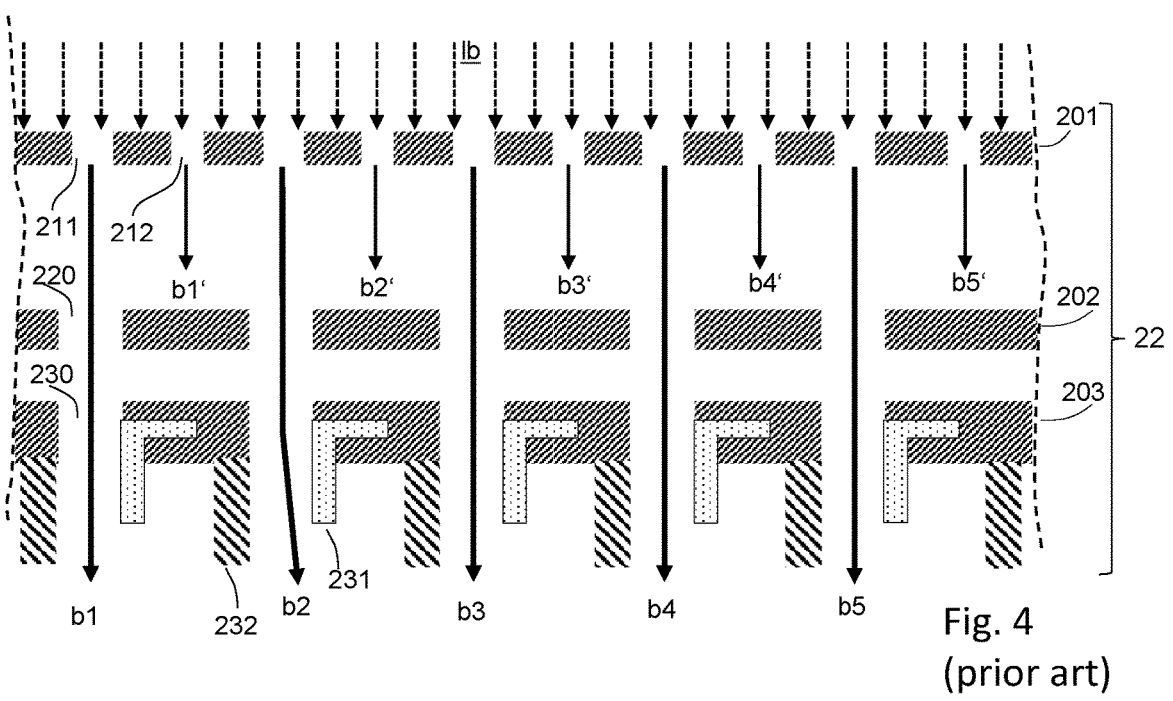
Fig. 4
(prior art)
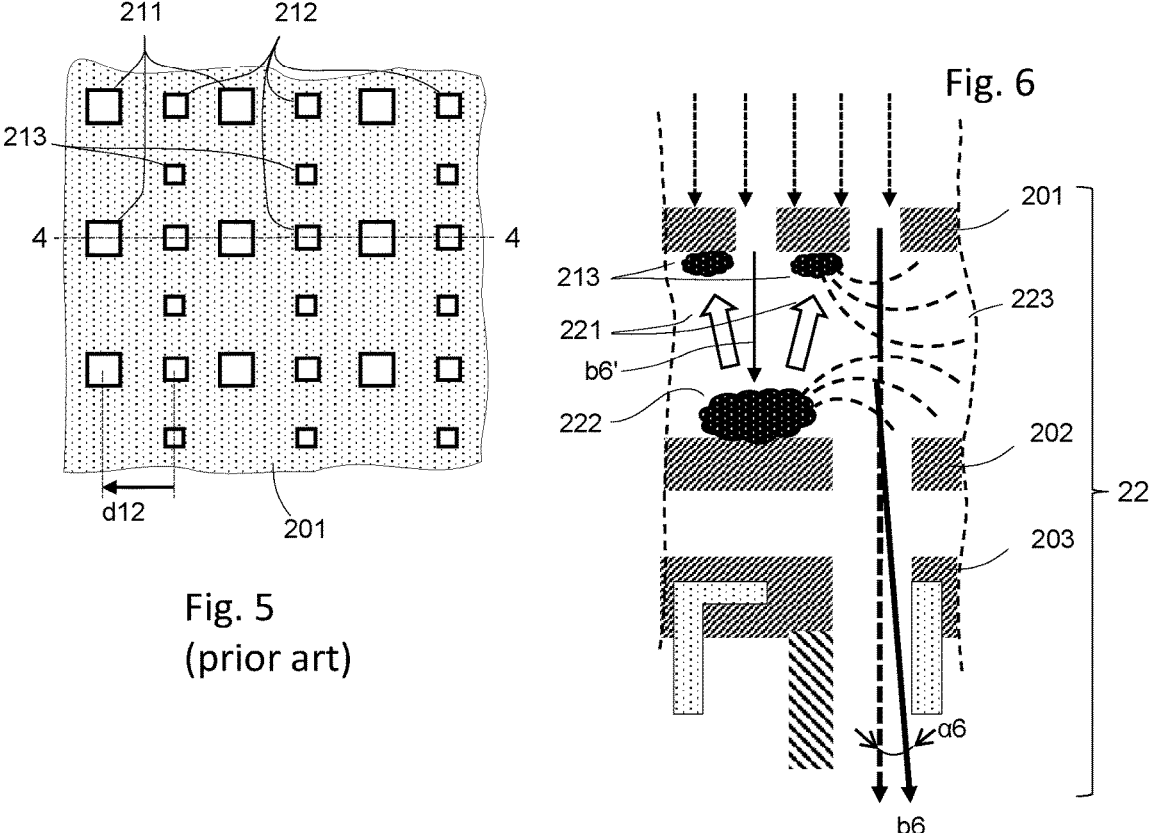
Fig. 5
(prior art)
Fig. 6

MULTI-BEAM PATTERN DEFINITION DEVICE

CROSS-REFERENCE TO RELATED APPLICATION

The current application claims priority to European Patent Application No. 22171589 filed on May 4, 2022, the disclosure of which is incorporated herein by reference in its entirety for all purposes.

FIELD OF THE INVENTION

The invention relates to a multi-beam pattern definition device for use in a particle-beam processing or inspection apparatus, which device is adapted to be irradiated with a beam of electrically charged particles, in particular electrons, and allow passage of the beam through a plurality of apertures, thus forming a corresponding number of beamlets, said device comprising several components including an aperture array device in which the mentioned apertures are defined for forming a corresponding number of beamlets.

BACKGROUND

Pattern definition devices (hereinafter also abbreviated as "PD devices") of the mentioned type and charged-particle multi-beam processing apparatuses incorporating such PD devices are disclosed in U.S. Pat. Nos. 6,768,125, 8,546,767, and 9,269,543 of the applicant, the teachings of which are hereby incorporated into the present disclosure.

The mentioned documents describe a charged-particle lithography and processing method and apparatus dubbed PML2 (short for "Projection Mask-Less Lithography"); several publications by the applicant describe a processing apparatus called eMET (short for "electron multi-beam Mask Exposure Tool"). These apparatuses realize a multi beam writing concept and use a programmable aperture plate system (APS) as a PD device for structuring a particle beam, which is extracted from a single source of electrically charged particles.

SUMMARY OF THE INVENTION

According to a first aspect of the invention a multi-beam pattern definition device for use in a particle-beam processing or inspection apparatus, the device being adapted to be irradiated with a beam of electrically charged particles and allow passage of the beam through a plurality of apertures thus forming a corresponding number of beamlets, comprises:

an aperture array device in which said apertures are realized, wherein the aperture array device comprises at least two sets of apertures, each set of apertures comprising a plurality of apertures arranged in a substantially regular arrangement on the aperture array device with the arrangements of said sets being interlacing at least partially, wherein the apertures of different sets are, at least in a region where the arrangements are interlacing, offset to each other by displacements which correspond to a common displacement vector, an opening array device located downstream of the aperture array device and having a plurality of openings configured for the passage of beamlets that are formed by at least a subset of said apertures, said opening array device comprises impact regions, said impact regions being located at locations corresponding to apertures of at least one of said set of apertures in at least a region corresponding to said region of interlacing of arrangements, wherein charged particles which passed through apertures of the at least one of said set of apertures corresponding to impact regions impinge upon said impact regions, wherein said plurality of openings in the opening array device are arranged in a substantially regular arrangement corresponding to the arrangement of at least one other of said sets of apertures of the aperture array device in said region, wherein said aperture array device comprises a plurality of additional apertures, which are located outside the region of interlacing arrangements of the at least two sets of apertures, said additional apertures are configured for the passage of charged particles to form additional beamlets, wherein said opening array device comprises additional impact regions, said additional impact regions being located at locations corresponding to the additional apertures of the aperture array device such that charged particles which passed through additional apertures impinge upon additional impact regions.

By virtue of this solution lateral beamlet displacements at the rim portion of the aperture array device are reduced. It is to be emphasized that in a typical layout all beamlets formed by the additional apertures, which are typically located at the rim region just outside of the region of the interlacing aperture arrangements, will be blocked at the opening array device, at the respective additional impact regions.

It may be provided that charged particles which impinge on impact regions form local charge distributions, wherein charged particles which impinge on additional impact regions form additional local charge distributions, wherein the additional apertures are configured such that an electric charge of an additional local charge distribution is substantially equal to an electric charge of a local charge distribution.

It may be provided that the at least two sets of apertures of the aperture array device are located at a centre portion of the aperture device and the additional apertures are located at a rim portion of the aperture device, wherein said rim portion at least partly, preferably completely, surrounds the centre portion.

It may be provided that the rim portion surrounds the centre portion, wherein the rim portion extends over at least 10% of the total surface of the aperture array device.

It may be provided that the aperture array device and the opening array device are arranged to each other such that first beamlets that are formed by a first set of apertures of the aperture device can pass through a set of corresponding openings of the opening array device, wherein second beamlets that are formed by a second set of apertures of the aperture device can impinge on the impact regions of the opening array device, said impact regions correspond to apertures of the second set of apertures, wherein charged particles of the second beamlets form local charge distributions at each impact region which corresponds to respective apertures of the second set of apertures, wherein third beamlets that are formed by the plurality of additional apertures of the aperture device can impinge on the additional impact regions of the opening array device, said additional impact regions correspond to additional apertures, wherein charged particles of the third beamlets form additional local charge distributions at each additional impact region which corresponds to respective additional apertures.

It may be provided that the additional apertures are arranged in a further substantially regular arrangement on the aperture array device, wherein preferably said further substantially regular arrangement being a continuation of one of the at least partially interlacing substantially regular arrangements of the at least two sets of apertures on the aperture array device. Typically, this further substantially regular arrangement represents an arrangement of additional apertures which can realize a continuation of the respective arrangement from the center portion into the rim portion.

It may be provided that the size of the additional apertures is such that the additional local charge distributions, formed by additional beamlets which impinge upon the additional impact regions of the opening device, are essentially equal to local charge distributions, formed by beamlets which impinge on the impact regions of the opening device.

It may be provided that the density of additional apertures per aperture array device surface is essentially equal to the density of apertures per aperture array device surface of one of the at least two sets of apertures.

It may be provided that the distance between an aperture of one of the at least two sets of apertures and an adjacent additional aperture is at least equal to or greater than a distance between two adjacent apertures of one of the at least two sets of apertures.

It may be provided that the device further comprises a deflection array device having a plurality of blanking openings located such that each of the beamlets traverses one of the blanking openings along a nominal path, the deflection array device comprising a plurality of electrostatic deflector electrodes, each of which is associated with a blanking opening and is configured to deflect a beamlet traversing the respective blanking opening by an amount sufficient to deflect the beamlet off its nominal path when an activating electric voltage is applied to the respective electrode.

It may be provided that the device further comprises a positioning arrangement for positioning at least one of the aperture array device and the opening array device for adjusting the relative position of the aperture array device with respect to the opening array device, said positioning arrangement being configured to selectively bring a selected set of the sets of apertures in the aperture array device into alignment with the plurality of openings in the opening array device in at least said region of interlacing of arrangements.

BRIEF DESCRIPTION OF THE DRAWINGS

In the following, in order to further demonstrate the present invention, illustrative and non-restrictive embodiments are discussed, as shown in the drawings, which show:

FIG. 4 a sectional detail of a PD setup having a three-plate configuration, in which an AAD realized as an aperture plate comprises two sets of apertures; the first set of apertures is activated, while the second set is stopped at the opening array device;

FIG. 5 a top view of a portion of the aperture plate of a PD system of the invention;

FIG. 6 a detailed view of FIG. 4 which also illustrates the potential generation of electrically charged secondary particles and subsequent electrical charge accumulation at various sites of the aperture array device and at impact regions of the opening array device;

DETAILED DESCRIPTION OF THE INVENTION

Figure 1:
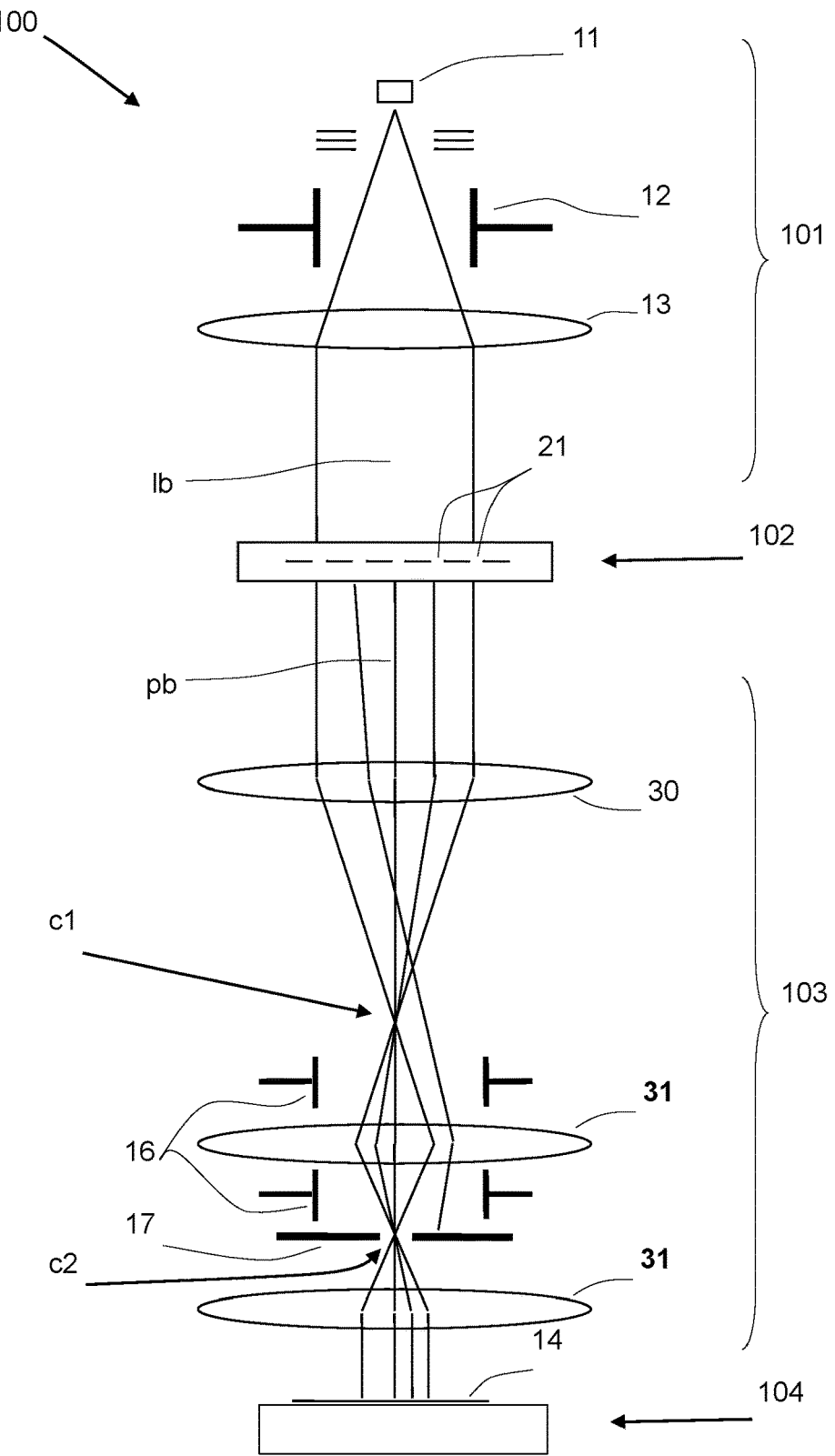
FIG. 1 a particle-beam exposure apparatus suitable for the invention in a longitudinal sectional overview.

In the following, first the technical background of the invention is discussed—as far as relevant to typical embodiments of the invention—, then an exemplary embodiment of the invention is presented in detail.

The detailed discussion of exemplary embodiment of the invention given below discloses the basic concepts and further advantageous developments of the invention. It will be evident to the person skilled in the art to freely combine several or all of the embodiments discussed here as deemed suitable for a specific application of the invention. Throughout this disclosure, terms like "advantageous", "exemplary", "typical", or "preferred" indicate elements or dimensions which are particularly suitable (but not essential) to the invention or an embodiment thereof, and may be modified wherever deemed suitable by the skilled person, except where expressly required. It will be appreciated that the invention is not restricted to the following embodiments or the particular layout of the PD system, which merely represent one of the possible applications of the invention, and are given for illustrative purpose and merely present suitable implementations of the invention; also, embodiments of the invention are suitable for other types of processing systems that use a multi-beam setup for exposure of a target. Within this disclosure, terms relating to a vertical direction or vertical propagation, such as "upper" or "upstream, are to be understood with regard to the direction of the beam, which is thought to run downwards along a longitudinal direction ("vertical axis"). This vertical axis, in turn, is identified with the Z direction, to which the X and Y directions are transversal.

Usually, a PD device comprises an aperture array device, an opening array device and a deflection array device which, in accordance with U.S. Pat. No. 8,546,767, may be provided with "multiple multi beam arrays" that contain multiple arrays of apertures, by virtue of the aperture array device (AAD) comprising at least two sets of apertures, which each comprise a plurality of apertures arranged in a (substantially) regular arrangement on the AAD, with the arrangement of these two or more sets being interlacing at least partially, wherein the apertures of different sets are—at least in a region where the arrangements are interlacing— offset to each other by displacements which (substantially) correspond to a common displacement vector. In correspondence with this and as a means to select one of the sets of apertures, the opening array device comprises a plurality of openings which are configured for the passage of at least a subset of beamlets that are formed by the apertures of the AAD, wherein, in at least a region corresponding to said region of interlacing of arrangements, the opening array device comprises plurality of openings arranged in a substantially regular arrangement corresponding to the arrangement of one of the sets of apertures in said region, while it lacks openings (so the opening array device is opaque there) at locations corresponding to apertures of the other set(s) of apertures.

Furthermore, a deflection array device, for instance in the form of a so-called blanking plate, may often be present as an additional separate component of the PD device: The deflection array device has a plurality of blanking openings located such that each of the beamlets, formed in the AAD and transmitted by the opening array, traverses one of the blanking openings along a nominal path, wherein the deflection array device comprises a plurality of electrostatic deflector electrodes, each of which is associated with a blanking opening and is configured to deflect a beamlet traversing the respective blanking opening by an amount sufficient to deflect the beamlet off its nominal path when an activating electric voltage is applied to the respective electrode.

Furthermore, advantageously, positioning devices may be provided which can position the AAD, in order to adjust the position of the aperture array device relative to the opening array device and deflection array device. These positioning devices are configured to selectively bring one of the sets of apertures in the AAD, namely a selected set, into alignment with the plurality of openings in the opening array device and blanking array device, such that the apertures and openings and blanking openings are in alignment in at least the region of interlacing of arrangements.

While the above construction proved to be of great use, the inventors noted that in certain situations problems during use of the PD device could arise. At the opening array device, subsets of the beamlets are blocked by the bulk (in particular, by so called impact regions) of the opening array device. The interaction of beamlets (of charged particles as mentioned) with the bulk of the opening array device may often cause generation of secondary particles, for example electrons. While part of the secondary particles will remain within the material, a certain fraction may be emitted from the material, in angular directions covering a polar angular range of 0 to 90 degrees and an azimuthal angle range of 0 to 360 degrees. Here, the polar angle is the angle between the emission direction and the surface normal of the opening array device, pointing essentially from said opening array device towards the nearest part of the AAD. For secondary particles, the angular distribution will typically follow a cosine law (with respect to the polar angle) with a maximum at a polar angle of 0 degrees. Such emission of secondary particles will occur typically within several µm (for electron beamlets with 5 keV energy) around the site where the beamlet impinges on the surface of the opening array device.

Where electrically charged secondary particles (especially electrons) occur, they will, predominantly in direct line of sight, potentially deposit and accumulate charge at other sites of the AAD and opening array device. Accumulation of electric charge is promoted by locally pronounced low electric conductivity at those sites, which hinders the charge to flow or dissipate towards electric ground.

The accumulated electric charge will generate an electric field which may deflect the (primary) beamlets in the close vicinity, which may and cause unwanted beamlet displacement at the target surface, resulting in a degradation of pattern fidelity. This may also involve a locally pronounced low electric conductivity caused by surface contamination of the aperture array device or the opening array device. Such contaminations may be caused, for instance, by particles or fabrication process remainders or by decomposition of residual gas molecules (predominantly those containing carbon) by primary beamlet particles and subsequent deposition (of carbon containing solid material).

The lateral dimension of the totality of sites with accumulated electric charge at opening array device and AAD, that is the overall charging area, will approximately coincide with the lateral dimension of the array defined by blocked beamlets.

The local beamlet deflection effect as described above will be exceeded by another one with enhanced influence on beamlets.

Firstly, electric fields from several charging areas, which are located approximately symmetric and nearby around a specific beamlet, will sum up to a local resultant field with reduced lateral component, thus cause reduced lateral deflection, compared to a single charging site.

Secondly, the electric fields of the overall charging area, generated by the local charge accumulations, will superimpose to a relatively smooth varying field and corresponding potential distribution between opening array device and AAD. This is equivalent to a field and corresponding potential distribution within a capacitor built of two parallel plates, where the size of the plates corresponds to the overall charging areas of opening array device and AAD.

The superimposed field spreads out farther than a single local charge induced field, therefore all beamlets which are crossing the superimposed field will interact with the field.

Between the centers of the overall charging areas, the superimposed field will predominantly be oriented parallel to the surface normal of opening array device and AAD.

All beamlets, which traverse this central zone, will experience negligible lateral deflection, thus resulting in negligible positioning errors at the target surface. At the rim of the overall charging areas, the superimposed field will vanish towards the non-charging regions, equivalent to fringe fields at the rim of a parallel plate capacitor. This causes non negligible lateral field components and therefore lateral deflection of crossing beamlets.

The inventors became aware that unwanted beamlet displacements will occur predominantly at a rim portion of the aperture array and the opening array, that is at the transition zone from the area with apertures and corresponding openings to the area without apertures. The largest beamlet displacement is expected to occur for the outermost beamlets, while this effect will vanish for beamlets located more toward the center of the aperture array.

In view of the above it is an object of the invention to improve the layout of a PD device to overcome the problems mentioned above, and in particular to reduce lateral beamlet displacements at the rim portion of the aperture array device.

This object is solved with a multi-beam pattern definition device according to claim 1. Preferred embodiments are described in depended claims.

Charged-Particle Multi-Beam System

A schematic overview of a charged-particle multi-beam mask exposure tool (mask writer) 100 of the type of an eMET system, employing embodiments of the invention, is shown in FIG. 1. In the following, only those details are given as needed to disclose the certain embodiments of the invention such that one of ordinary skill in the art can practice the respective embodiments; invention; for the sake of clarity, the components are not shown to size in FIG. 1, particularly the lateral width of the particle beam is exaggerated; for more details, the reader is referred to U.S. Pat. Nos. 6,768,125, 8,546,767, and 7,781,748, whose teachings with respect to the overall layout of the particle-beam apparatus and the PD device are herewith included by reference.

A source suitable for generating an electron beam is used in the system 100. In a variant, the beam could be realized with other electrically charged particles, in particular ions of positive charge, using a suitable ion source. A particle-optical illumination system forms the beam into a wide beam which illuminates a PD device having a regular array of apertures in order to define a beam pattern to be projected on a target surface. With each aperture, a small beam, hereinafter usually referred to as 'beamlet' is defined, and the passage of each beamlet through an aperture can be controlled so as to allow ('switch on') or effectively deactivate ('switch off') the passage of particles of the beam through the apertures and/or subsequent demagnifying charged-particle projection optics towards the target.

The beamlets traversing the aperture array form a patterned particle beam as represented by the spatial arrangement of the apertures and including information of on-off definitions for the individual beamlets. The patterned beam is then projected by means of a demagnifying charged-particle optical projection system onto the target (for instance, a mask blank or a semiconductor wafer substrate) where an image of those apertures whose corresponding beams are not deflected is thus formed to expose or to modify the target at the irradiated portions. The images formed by the beamlets projected to the substrate form a "pattern image", which is exposed along a straight path ("stripe") on the substrate mechanically moving in one direction; the (large-scale) motion of the substrate is usually achieved by a continuous motion of the target stage, possibly with fine adjustment of the projection system at the same time. The direction of movement of the image relative to the stage is also dubbed (main) scanning direction. An additional scanning of the beam in a direction perpendicular to the main scanning direction is done only within a small lateral range, for instance to compensate for lateral travel motion errors of the scanning stage and/or to include a (limited) number of parallel pixel rows, as explained more in detail in U.S. Pat. No. 9,053,906 of the applicant, which document is herewith included by reference.

The main components of the apparatus 100 are—in the order of the direction of the beam lb, pb which in this example runs vertically downward in FIG. 1—an illumination system 101, a PD system 102, a projecting system 103, and a target station 104 with the target or substrate 14. The charged-particle optical systems 101, 103 are realized using electrostatic and/or electromagnetic lenses. The charged-particle optical parts 101,102,103 and the target station 104 of the apparatus 100 are contained in a vacuum housing (not shown) held at high vacuum to ensure an unimpeded propagation of the beam lb, pb along the optical axis of the apparatus.

The illumination system 101 comprises, for instance, an electron or ion source 11, an extractor arrangement defining the location of the virtual source, a general blanker 12, which in the case of using ion beams may also be used as particle filter, and an illumination charged-particle optics realized by a particle optical condenser lens system 13.

In the embodiment shown the particle source 11 emits energetic electrons of a suitable kinetic energy such as, e.g., 5 keV; in other implementations, other electrically charged particles such as ions of primarily a certain species may be used, such as hydrogen or Ar+ ions having a defined (kinetic) energy of typically several keV (e.g. 5 keV at the PD system 102) with a comparatively small energy spread of, e.g., $\Delta E=1$ eV. A velocity/energy dependent filter (not shown) may be provided to filter out other, unwanted particle species that may also be produced in the source 11; the filter may also be used to blank out the beam as a whole during repositioning of the beamlets. By means of the condenser lens system 13, the charged particles emitted from the source 11 are formed into a wide-area, substantially telecentric beam ("illuminating beam") lb.

The beam lb then irradiates a blanking device which, together with the devices needed to keep its position (not shown), forms the PD device 102, which is described in more detail below with reference to FIG. 2 □ The PD device is held at a specific position in the path of the beam lb, which thus irradiates an aperture array pattern formed by a plurality of apertures 21. As already mentioned, each of the apertures can be "switched on" or "off". In a "switched on" or "open" state, an aperture allows the beamlet passing through the respective aperture to reach the target; it is then said, the aperture is transparent to the incident beam. Otherwise, the aperture is "switched off" or "closed", in which case the beam path of the respective beamlet is affected (e.g. by means of deflecting electrodes to which a transverse voltage is applied; see beamlet b2 of FIG. 4) in a way that it will be absorbed or otherwise removed out of the beam path before it can reach the target; thus, the aperture is effectively non-transparent or opaque to the beam.

The pattern of switched-on apertures is chosen according to the pattern to be exposed on the substrate, as these apertures are the only portions of the PD device transparent to the beam lb, which is thus formed into a patterned beam pb emerging from the apertures (i.e., in FIG. 1, below the PD system 102). The architecture and operation of the PD device, in particular with regard to its blanking plate, is discussed in detail below. In FIG. 1 only five beamlets are shown in the patterned beam pb, while it will be clear that the actual number of beamlets is very large, i.e. typically many thousands or even in the order of millions; of the beamlets shown, the second from the left is depicted switched off as it is deflected within the PD device 102 and absorbed on a stopping plate 17, which is situated at or near the second cross-over c2 of the charged particle projection optics; the other beamlets, which are switched-on, pass through a central opening of the plate 17 and thus are projected onto the target The pattern as represented by the patterned beam pb is projected by means of a charged-particle optical projection system 103 towards the substrate 14 (such as a 6″ mask blank with resist coating); since the beamlets which are switched off are absorbed at the stopping plate 17, only the switched-on beamlets will form an image of the switched-on apertures. The projection system 103 implements a demagnification of, for instance, 200:1, as realized by the applicant. The substrate 14 may be, for instance, in the case of an eMET-type system a 6-inch mask blank or a nanoimprint 1× mask or master template, covered with an resist layer, whereas for a PML2 system the substrate 14 may be a silicon wafer covered with a particle sensitive resist layer. The substrate 14 is held and positioned by a substrate stage (not shown) of the target station 104.

The projection system 103 is, for instance, composed of two consecutive charged-particle optical projector sections with a crossover c1 and c2, respectively. The particle-optical lenses 30, 31 (comprising, for instance, an electrostatic multi-electrode accelerating lens 30 and two magnetic lenses 31) used to realize the projectors are shown in FIG. 1 in symbolic form only as technical realizations of electrostatic imaging systems are well known in the prior art; in other embodiments of the invention, also magnetic and/or electromagnetic lenses may be included as suitable. The first projector section images the plane of the apertures of the PD device to an intermediate image which in turn is imaged onto the substrate surface by means of the second projector section. Both sections employ a demagnifying imaging through crossovers c1,c2; thus, while the intermediate image is inverted, the final image produced on the substrate is upright (non-inverted). The demagnification factor is about 14:1 for both stages, resulting in an overall demagnification of 200:1. A demagnification of this order is in particular suitable with a lithography setup, in order to elevate problems of miniaturization in the PD device. The charged-particle optical lenses are mainly composed of electrostatic electrodes, but magnetic lenses may also be used.

Further details of the charged-particle optical system can be found in the above-cited prior art.

As a means to introduce a small lateral shift to the image, i.e. along a direction perpendicular to the optical axis cx, deflection means 16 are provided in one or both of the projector sections. Such deflection means may be realized as, for instance, a multipole electrode system, as discussed in U.S. Pat. No. 6,768,125. Additionally, an axial magnetic coil may be used to generate a rotation of the pattern in the substrate plane where needed. The lateral deflections are usually quite small in comparison to the lateral width of the patterned beam by itself, in most cases in the order of a few widths of a single beamlet or the distance between neighboring beamlets, but still at least one order of magnitudes below the beam width (it should be appreciated in this context that the lateral distance between beamlets is considerably smaller than the entire width of the beam bp).

By virtue of the pattern formed in the PD device 102, an arbitrary beam pattern can be generated and transferred to a substrate.

PD System and Plate Architecture

Figures 2, 3:
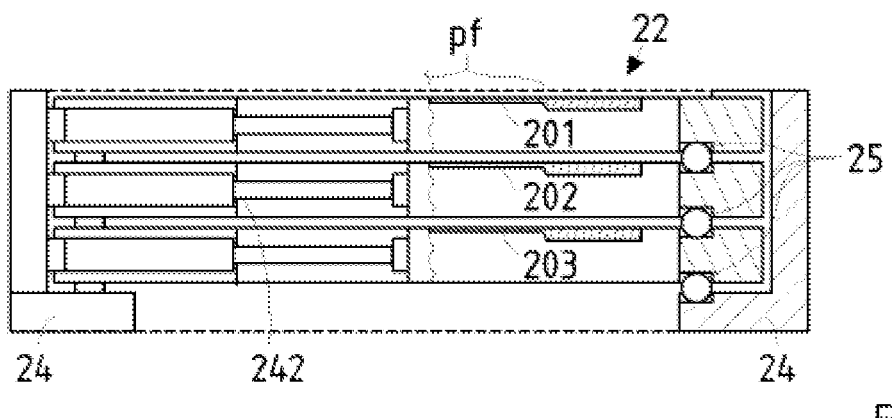
FIG. 2 a top view of a PD system.
FIG. 3 a side view in a partial section of the PD system of FIG. 2.

FIG. 2 and FIG. 3 show one embodiment of the PD system 102 of the apparatus 100, namely, in FIG. 2 a top view and in FIG. 3 a combined side and longitudinal-sectional view. FIG. 4 shows a detail of the sectional view in FIG. 3, a section of the plates of the PD system 102 along the paths of five beamlets traversing the PD system 102 (five other prospective beamlets are eliminated within).

The PD system 102 comprises a number of plates 22 mounted in a stacked configuration, realizing a composite device whose components serve respective functions, including for instance an aperture array device (also referred to as aperture plate) 201, an opening array device (also referred to as beam selection plate) 202 and a deflection array device (also referred to as blanking plate) 203. Further component plates may also be present, such as an adjustment plate for individual fine adjustment of the beamlet paths (not shown here, cf. U.S. Pat. No. 6,768,125). Each of the plates 22 is realized as a semiconductor (in particular silicon)

wafer in which the structures were formed by micro-structuring techniques known in the art, in particular a membrane portion formed in the middle of the plate, representing a PD field pf having a plurality of openings, symbolized by a cross-hatching in FIG. 2. The lithography beam traverses the plates through the consecutive openings in the PD field pf as further explained below.

The plates 22 are held by chucks 23 which are positioned with respect to each other by means of actuator devices 241, 242, 243 which are realized as piezoactuators or nanopositioning elements of known type, attached to the chucks through flexure joints and fixed at a support structure 24 of the PD system. In the vertical direction the chucks are connected using slideable bearings 25. Preferably, the plates 22 and chucks 23 are produced from the same material, e.g. silicon, or materials having the same thermal expansion behavior in the operating temperature range. The chucks also provide for the electric supply of the blanking plate 203; for the sake of clarity, the electric lines are not shown in the figures.

In the plates 22 reference marks 26 may be provided for the definition of reference beams. The shape of the reference beams rb is defined, for instance, in an opening formed in one of the plates 22, for instance the aperture plate 201, whereas the corresponding openings in the other plates are wide enough so as to let pass the radiation for the reference beams. The reference beams are then imaged together with the patterned beam pb; in contrast to the patterned beam, however, the reference beams do not reach the substrate 41 but are measured in an alignment system (cf. U.S. Pat. No. 7,772,574). Furthermore, the chucks 23 may have alignment openings 236 which serve as alignment markers for relative positioning of the chucks 23 and the plates 22 they hold.

The thickness of the membrane portion in each of the plates 22 is about 30 to 100 μm; the membrane of the blanking plate may be thicker if this is suitable in view of better thermal conductivity. The frame portion of the plates is well thicker, in the order of 0.750 mm. The mutual distance of the plates is in the order of 0.5 to a few mm. It should be noted that in FIG. 4 the dimensions in the longitudinal axis (z-axis parallel to the optical axis of the apparatus) are not to scale.

FIG. 4 shows a longitudinal section detail of the membrane portions of the plates 22 of FIG. 3; only the portion corresponding to the path of ten prospective beamlets (from which, five are selected as final beamlets) out of a large number of beamlets in the PD field pf are shown. As already mentioned, the embodiment shown realizes a three-plate arrangement composed of three plates 201, 202, 203, of which the first plate 201 realizes an AAD (aperture plate), the second plate 202 realizes an opening array device (beam selection plate), while the third plate 203 serves as a deflection array device (blanking plate). The first plate is an aperture array device realized as an aperture plate 201 having multiple sets of apertures 211, 212 of different size and/or shape as further explained below. The apertures 211 define prospective beam lets b1 . . . b5, while the apertures 212 define prospective beam lets b1' . . . b5'; all prospective beamlets thus formed travel towards the beam selection plate 202. The beam selection plate is equipped with apertures 220 such that only one set of prospective beam lets can move further, here apertures 211 and beam lets b1 . . . b5, while the other prospective beamlets (here b1' . . . b5') are eliminated by essentially being absorbed at the beam selection plate. To this end the openings 220 in the beam selection plate have a width which is larger than the apertures 211, 212.

FIG. 5 shows a top view of a portion of the aperture plate 201, where the portion shown comprises only 3×3 groups of apertures, each group comprising three different types 211, 212, 213 of apertures. The line 4□4 depicts the line of section for the sectional view of FIG. 4. The arrow d12 indicates the relative offset between an aperture 211 of one type and an aperture 212 of another type, by which offset the aperture plate is shifted for selecting the apertures 212 rather than the apertures 211.

The third plate 203 of the PD system 200 is a deflection array plate, usually called blanking plate. It has a set of openings 230 whose positions correspond to the path of beamlets b1 . . . b5 as determined by the aperture plate 201; but the openings 230 have widths that are greater than those of the apertures 211, 212 (in other words, the openings 230 are larger) so the beamlets pass through the former without affecting the blanking plate material. Each of the openings 230 is provided with electrodes 231, 232 so as to be able impart a small but sufficient deflection to the corresponding beamlet, depending on an electric voltage selectively applied between each pair of electrodes 231, 232; for instance, one electrode 232 is held at a ground potential and serves as counter electrode, while the other electrode 231 serves as active electrode which is connected with a circuit layer of the blanking plate 203 for applying a electric potential for deflecting the selected beam let(s) b1 . . . b5. Each beam let can thus be deflected individually. The blanking plate also comprises the circuitry for electronic controlling and electric supply of the electrodes. Further details of a PD device, including details of the circuitry of a blanking plate, are discussed in U.S. Pat. Nos. 6,768,125, 7,781,748, as well as U.S. Pat. No. 8,222,621 B2 of the assignee/applicant.

Each of the beam lets b1 . . . b5 thus selected traverses the subsequent openings of the plates 22 along its nominal path provided the corresponding blanking electrodes 231, 232 are not energized; this corresponds to the "switched-on" state of the aperture. A "switched-off" aperture is realized by energizing the electrodes, namely, applying a transverse voltage. In this state, as shown with beamlet b2, the corresponding blanking electrodes 231, 232 deflect the beamlet b2 off its nominal path so the beamlet is deflected to a (slightly but sufficiently) different path which eventually leads to some absorbing surface, preferably on a blocking aperture 17 located around one of the crossovers c1, c2 (FIG. 1). In the exemplary depiction of FIG. 4 the angle of deflection of the deflected beamlet b2 is shown exaggerated for better visibility.

Aperture Plate, Multiple Aperture Grids and Supplementary Apertures, Opening Array Device The apertures 211, 212, and preferably the corresponding openings 220 in the beam selection plate and corresponding openings 230 in the blanking plate as well, are arranged in a systematic manner along defined grids. Each grid is, for instance, a regular rectangular array, or a regular array forming staggered lines running parallel to a direction which corresponds to the relative movement of the images of the apertures over the target as described in U.S. Pat. No. 6,768,125. In each line of the arrangement the offset between consecutive apertures of same type is preferably a multiple of a grid width underlying the aperture arrangement, as illustrated in FIG. 5 for one embodiment of the invention. The openings shown in FIG. 5 shows three interlaced grids which each represent such an arrangement. Generally, the apertures will be located on the points of a substantially regular two-dimensional lattice, but the lattice may additionally have small deviations from an exact regular lattice in order to account for possible distortions in the imaging system, so as to compensate such imaging errors by small deviations in the positions of the apertures and achieve an exact, compensated position of the respective aperture images on the target.

As described above, the aperture plate comprises multiple sets of apertures, wherein each set of apertures can be selected to be imaged onto the target. Further details of a PD device, concerning selection of a certain set of apertures and mutual alignment of aperture plate, beam selection plate and blanking plate are discussed in U.S. Pat. No. 6,768,125.

Figure 7:
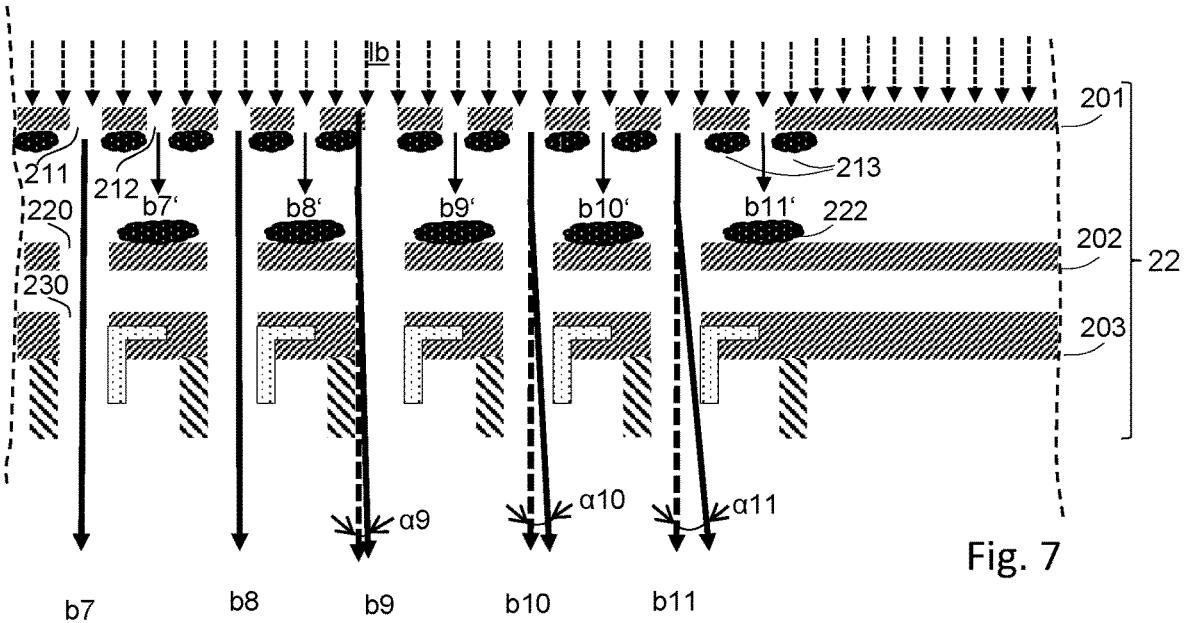
FIG. 7 a sectional detail view similar to FIG. 4, but illustrating multiple local charging sites (or distributions) depicted, at a rim portion of the regular aperture array.
Figure 8:
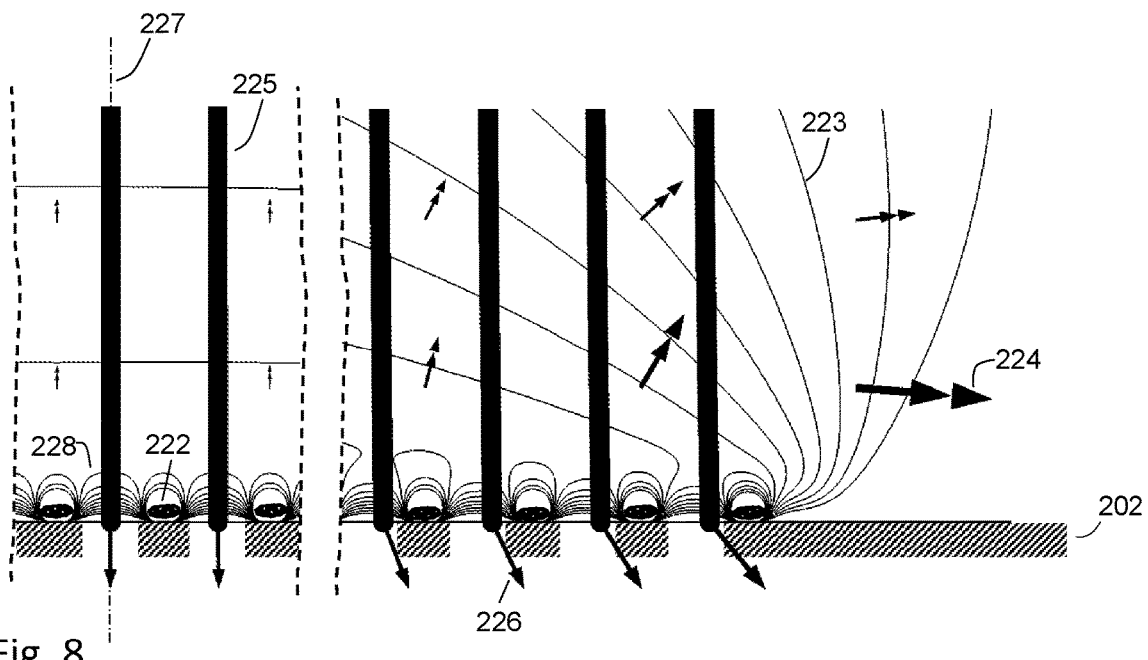
FIG. 8 a calculation result for an array of local charging sites at impact regions of the opening array device; a part of the interior portion of the array ("center") is depicted at the left, while the rim portion is depicted at the right.

FIG. 6, FIG. 7 and FIG. 8 depict the problems in the use of the PD device as observed by the inventors and already described above (section "prior art").

FIG. 6 is an enlarged partial view of FIG. 4. The beamlet b6' (which may be any one of beam lets b5' of FIG. 4), will interact with the bulk material of the beam selection plate 202 and generate secondary particles 221, for example electrons. While some part of the secondary particles will remain within the material, the other part will be emitted from the material. Predominantly in direct line of sight, the secondary particles (especially electrons) may deposit and cause an accumulation of electric charge at impact regions (that is, portions or regions of the surface of the beam selection plate 202 which correspond to apertures of at least one of the set of apertures of the aperture plate 201), of the beam selection plate and possibly also at the aperture plate 201 above it, denoted by reference numbers 222 and 213 in FIG. 6. Where such electric charge is accumulated, it will form an electric field, symbolized by the dashed electric force lines 223 in FIG. 6, which may have the effect of deflecting the beamlet b6 (which can be any one of beam lets b1 . . . b5 of FIG. 4), thus causing unwanted beamlet displacement at the target surface and therefore degrade pattern fidelity.

FIG. 7 shows multiple local charge distributions (also called charging sites) located near to a rim portion of the array. At the rim portion of the regular aperture array device 201 and the rim portion of the opening array device 202 the lateral deflection of beamlets gets larger, wherein for beamlets closer to the center of the aperture array device 201 the deflection gets smaller, as indicated by increasing deflection angles □9, □10, □11 towards the rim portion. The center of the aperture array device (and the opening array device respectively) is essentially a center area or center portion at the interior surface area of the aperture array device 201. The center portion is partially, preferably entirely, surrounded by a rim portion, which can also be described as a frame surrounding the center area.

FIG. 8 shows, in a depiction according to a sectional view, a calculation result for an array of local charge distributions 222 located at impact regions of the opening array device 202. FIG. 8 illustrates the influence on beamlets, i.e. a local beamlet deflection effect, as described in detail below. In FIG. 8 a total of seven local charge distributions 222 at corresponding impact regions are shown. The center of the opening array device 202 is shown on the left side of FIG. 8 by a dashed dotted line 227, as well as two openings a1, a2 near to the center and the relative beamlets. A rim portion of the opening array device 202 with four openings a3, a4, a5, a6 is shown at the right side of FIG. 8. Several electric equipotential regions are drawn with thin solid lines 223 and 228, while the corresponding electric field is indicated as double headed arrows 224, pointing to the direction of acting force onto negatively charged particles at the respective locations of arrows. The relative amplitude of the electric field is indicated by the size of the double headed arrows 224. Beamlet paths are shown with thick black lines 225, the lateral position change with respect to undeflected beamlets is exaggerated for better visibility. Single headed arrows 226 at the openings of the opening array device 202 indicate the beamlet deflection angle at the opening array device surface, the deflection angle has been exaggerated for better visibility. Lateral beamlet deflection is increasing for beamlets at the rim portion of the regular opening array device 202.

Figure 9:
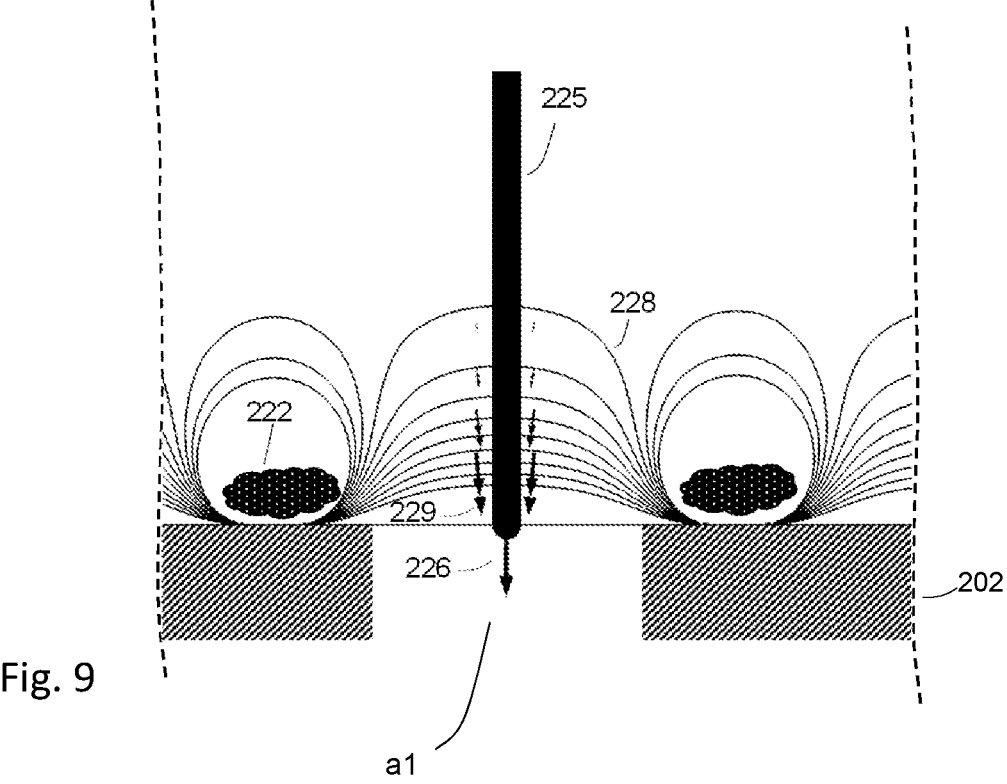
FIG. 9 a detailed view of FIG. 8, which shows, for one aperture located in the center, the charge accumulation at impact regions of the opening array device at both sides of the aperture, illustrating the symmetric distribution of accumulated charges and the electric potential resulting therefrom.

FIG. 9 shows an enlarged detail of FIG. 8 showing one aperture a1 and the pertinent beamlet 225, together with the associated electric potential distribution 228 which is generated by symmetrically placed local charge distributions (also called "sites of charge accumulation") 222 at impact regions of the opening array device 202. The aperture a1 shown in FIG. 9 is one in the interior of the aperture array. The corresponding electric field 229 at the mid position between sites of charge accumulation, where a regular beamlet 225 passes, is orientated predominantly parallel to the propagation direction of the regular beamlet 225. Therefore lateral deflection of the passing regular beamlet 225 will be smaller compared to a situation with one single charge accumulation site, as explained further below.

In contrast, in the space at some vertical distance from the single charging sites, between the opening array 202 device and aperture array device 201, the local charge distributions 222 generate an electric field across an overall charging area, said electric field superimposes to a relatively smooth varying potential distribution 223 (see FIG. 8) and a corresponding electric field 224 of negligible spatial variation. This is very similar to a field within a capacitor built of two parallel plates, where the size of the plates corresponds to the overall charging areas of the opening array device 202 and aperture array device 201. The superimposed field 224 has a greater reach, and thereby a stronger effect on outer beamlets, than a field induced by a single local charge, therefore all beamlets which are crossing the superimposed field 224 will interact with said field. The superimposed field 224 at the rim portion just outside of the outermost aperture a6 will predominantly be oriented normal (or orthogonal) to the propagation direction of a regular beamlet (see FIG. 8).

All beamlets that traverse the interior (also called center or center portion) of the opening array device 202 (the area shown on the left side of FIG. 8) will experience negligible lateral deflection, thus resulting in negligible lateral beam displacement and angular deviation at the opening array device surface. This will cause negligible lateral beam displacement and angular deviation at the target surface as well.

In contrast, further outward of the rim portion of the opening array device 202, the superimposed field 224 will vanish towards the non-charging regions, in a way similar to fringe fields at the rim of a parallel plate capacitor. This will cause non-negligible lateral field components and, therefore, lateral beam displacement and angular deviation at the opening array device surface and the target surface.

Figure 10:
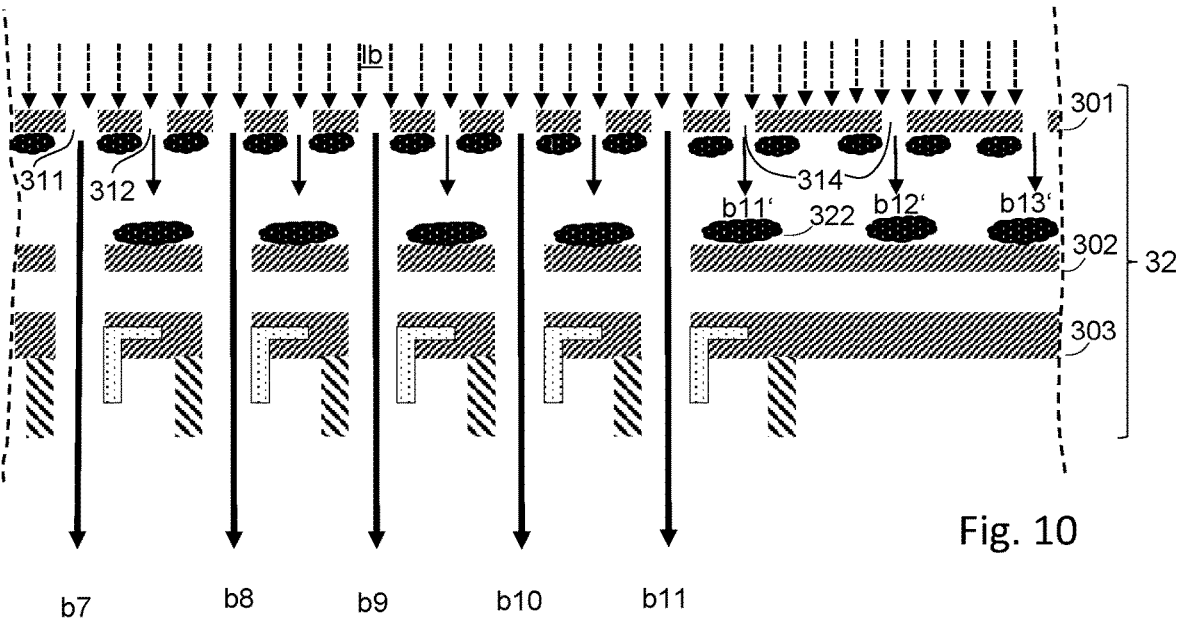
FIG. 10 a sectional view of an embodiment of the invention having additional apertures at a rim portion of the aperture array device.
Figure 12:
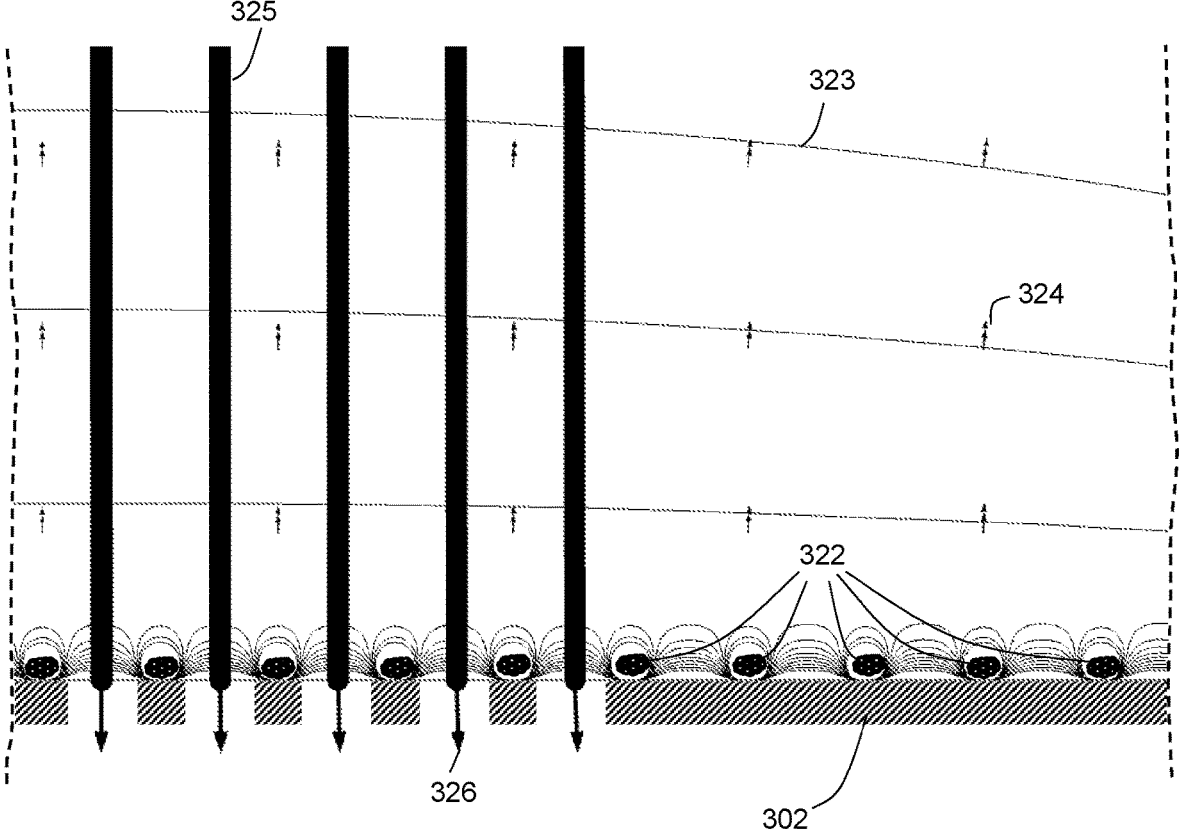
FIG. 12 a calculation result of an embodiment of the invention, for an array of local charging sites at impact regions of the opening array device, having additional impact regions due to additional apertures.

FIG. 10 shows, in a sectional view equivalent to those of FIGS. 4 and 7, one exemplary embodiment of the invention intended to overcome the unwanted lateral deflection of beamlets at the rim portion of the opening array device 302. This embodiment is based on a multi-beam pattern definition device 32 of the type as described in the section describing prior art, which comprises an aperture array device 301 and, preferably located downstream of the aperture array device 301, an opening array device 302. The aperture array device 301 comprises at least two sets of regular apertures 311, 312 which, at least partially, are used for the formation of beamlets b7 . . . b11 to be transferred to the target. A set of additional apertures 314, which set does not overlap with the aforementioned regular sets 311, 312, is located in the vicinity of the regular apertures and forms beamlets b11' . . . . b13' which will impinge upon impact regions of the opening array device 302. Like with the embodiment described above, this will generate additional local charge distributions 322 generating corresponding electric fields, which add to the superimposed field 323 (FIG. 12), and therefore laterally extend the superimposed field 323 towards the rim portion of the opening array device 302, in order to enlarge (or broaden) the overall charging areas laterally, as can be seen in FIG. 12. Consequently, in the regions above the rim portion the aforementioned non-negligible lateral field components are now reduced, because of their increased distance to the transition zone from charged to non-charged regions on the surface of the opening array device 302. In other words, the unwanted non-negligible lateral field components are "moved" outward to a far rim portion of the opening array device 302. This in turn will reduce the unwanted lateral deflections of beamlets.

Figure 11:
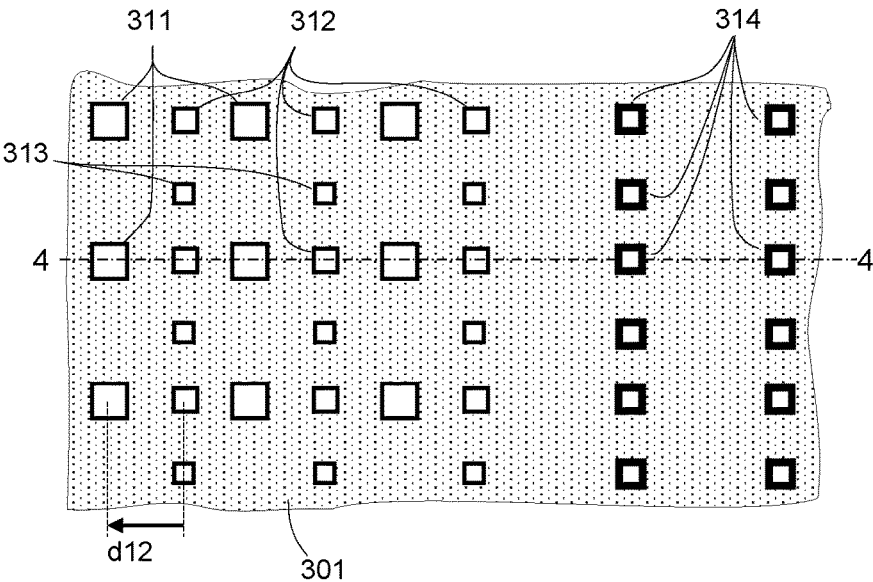
FIG. 11 a top view of a portion of the aperture array device of a PD system according to the invention, having additional apertures at a rim portion of the aperture array device.

FIG. 11 shows a top view of a portion of the aperture plate 301, which includes regular apertures and additional apertures. In the embodiment shown, the regular aperture sets comprise 3×3 groups of apertures, each group comprising three different types 311, 312, 313 of apertures. The line 4-4 depicts the line of section for the sectional view of FIG. 10. The arrow d12 indicates the relative offset between an aperture 311 of one type and an aperture 312 of another type, by which offset the aperture plate is shifted for selecting the apertures 312 rather than the apertures 311.

The sets of regular apertures 311, 312, 313 (in FIG. 11 only a small portion of the aperture plate 301 is shown, therefore the additional apertures 314 are only visible to the right-hand side of the regular apertures 311, 312, 313) are surrounded by additional apertures 314, thus realizing a plurality of apertures arranged in a substantially regular arrangement on the aperture array device 301. In the shown example, two rows of additional apertures 314 surround the regular apertures 311, 312, 313, wherein the additional apertures 314 are of the same size and there arrangement is uniform. It is, of course, possible to have only one or more than two rows of additional apertures 314 instead, and the additional apertures 314 may have different sizes and they may even be arranged in a non-uniform arrangement. The individual size and arrangement of the additional apertures 314 will advantageously be such that the resulting additional charge distributions (additional local charging sites respectively) at the impact regions of the opening array device 301 generate a superimposed field of similar amplitude and orientation like the one generated by the regular apertures 311, 312, 313.

FIG. 12 shows a depiction, according to a sectional view, of a calculation result for an array of local charge distributions at the opening array device 302 shown in FIG. 10. Thick vertical lines 325 indicate beamlet paths of beamlets passing through openings of the opening array device 302. At the rim portion of the opening array device 302 additional local charge distributions 322 create a laterally extended superimposed field 323. Double headed arrows 324 point to the direction of the force acting on negatively charged particles at the respective locations of arrows. Due to the lateral extension of the super imposed field 323 the beamlet deflection angle 326 at the rim portion of the opening array device surface is, in contrast to the situation shown in FIG.

8, negligibly small. As a result, beamlets at the rim portion of the opening array device 301 do not experience (unwanted) lateral deflection.

The invention claimed is:

1. A multi-beam pattern definition device for use in a particle-beam processing or inspection apparatus, said device being adapted to be irradiated with a beam of electrically charged particles and allow passage of the beam through a plurality of apertures thus forming a corresponding number of beamlets, said device comprising:

an aperture array device in which said apertures are realized, wherein the aperture array device comprises at least two sets of apertures, each set of apertures comprising a plurality of apertures arranged in a substantially regular arrangement on the aperture array device with the arrangements of said sets being interlacing at least partially, wherein the apertures of different sets are, at least in a region where the arrangements are interlacing, offset to each other by displacements which correspond to a common displacement vector, an opening array device located downstream of the aperture array device and having a plurality of openings configured for the passage of beamlets that are formed by at least a subset of said apertures, said opening array device comprises impact regions, said impact regions being located at locations corresponding to apertures of at least one of said set of apertures in at least a region corresponding to said region of interlacing of arrangements, wherein charged particles which passed through apertures of the at least one of said set of apertures corresponding to impact regions impinge upon said impact regions, wherein said plurality of openings in the opening array device are arranged in a substantially regular arrangement corresponding to the arrangement of at least one other of said sets of apertures of the aperture array device in said region, wherein said aperture array device comprises a plurality of additional apertures, which are located outside the region of interlacing arrangements of the at least two sets of apertures, said additional apertures are configured for the passage of charged particles to form additional beamlets, wherein said opening array device comprises additional impact regions, said additional impact regions being located at locations corresponding to the additional apertures of the aperture array device such that charged particles which pass through additional apertures impinge upon additional impact regions.

2. The multi-beam pattern definition device of claim 1, wherein charged particles which impinge on impact regions form local charge distributions, wherein charged particles which impinge on additional impact regions form additional local charge distributions, wherein the additional apertures are configured such that an electric charge of an additional local charge distribution is substantially equal to an electric charge of a local charge distribution.

3. The multi-beam pattern definition device of claim 1, wherein the at least two sets of apertures of the aperture array device are located at a centre portion of the aperture device and the additional apertures are located at a rim portion of the aperture device, wherein said rim portion at least partly or completely surrounds the centre portion.

4. The multi-beam pattern definition device of claim 3, wherein the rim portion surrounds the centre portion, wherein the rim portion extends over at least 10% of the total surface of the aperture array device.

5. The multi-beam pattern definition device of claim 1, wherein the aperture array device and the opening array device are arranged to each other such that:

first beamlets that are formed by a first set of apertures of the aperture device can pass through a set of corresponding openings of the opening array device;

second beamlets that are formed by a second set of apertures of the aperture device can impinge on the impact regions of the opening array device, said impact regions correspond to apertures of the second set of apertures, wherein charged particles of the second beamlets form local charge distributions at each impact region which corresponds to respective apertures of the second set of apertures; and third beamlets that are formed by the plurality of additional apertures of the aperture device can impinge on the additional impact regions of the opening array device, said additional impact regions correspond to additional apertures, wherein charged particles of the third beamlets form additional local charge distributions at each additional impact region which corresponds to respective additional apertures.

6. The multi-beam pattern definition device of claim 1, wherein the additional apertures are arranged in a further substantially regular arrangement on the aperture array device.

7. The multi-beam pattern definition device of claim 6, wherein said further substantially regular arrangement being a continuation of one of the at least partially interlacing substantially regular arrangements of the at least two sets of apertures on the aperture array device.

8. The multi-beam pattern definition device of claim 1, wherein the size of the additional apertures is such that the additional local charge distributions, formed by additional beamlets which impinge upon the additional impact regions of the opening device, are essentially equal to local charge distributions, formed by beamlets which impinge on the impact regions of the opening device.

9. The multi-beam pattern definition device of claim 1, wherein the density of additional apertures per aperture array device surface is essentially equal to the density of apertures per aperture array device surface of one of the at least two sets of apertures.

10. The multi-beam pattern definition device of claim 1, wherein the distance between an aperture of one of the at least two sets of apertures and an adjacent additional aperture is at least equal to or greater than a distance between two adjacent apertures of one of the at least two sets of apertures.

11. The multi-beam pattern definition device of claim 1, further comprising a deflection array device having a plurality of blanking openings located such that each of the beamlets traverses one of the blanking openings along a nominal path, the deflection array device comprising a plurality of electrostatic deflector electrodes, each of which is associated with a blanking opening and is configured to deflect a beamlet traversing the respective blanking opening by an amount sufficient to deflect the beamlet off its nominal path when an activating electric voltage is applied to the respective electrode.

12. The multi-beam pattern definition device of claim 1, further comprising a positioning arrangement for positioning at least one of the aperture array device and the opening array device for adjusting the relative position of the aperture array device with respect to the opening array device, said positioning arrangement being configured to selectively bring a selected set of the sets of apertures in the aperture array device into alignment with the plurality of openings in the opening array device in at least said region of interlacing of arrangements.

\* \* \* \* \*